US012548514B2

(12) United States Patent
Wang

(10) Patent No.: US 12,548,514 B2
(45) Date of Patent: Feb. 10, 2026

(54) DISPLAY BASEPLATE AND DRIVING METHOD THEREOF, AND DISPLAY DEVICE

(71) Applicant: BOE Technology Group Co., Ltd., Beijing (CN)

(72) Inventor: Li Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 18/854,784

(22) PCT Filed: Jan. 17, 2024

(86) PCT No.: PCT/CN2024/072801
§ 371 (c)(1),
(2) Date: Oct. 7, 2024

(87) PCT Pub. No.: WO2024/174776
PCT Pub. Date: Aug. 29, 2024

(65) Prior Publication Data

US 2025/0356802 A1 Nov. 20, 2025

(30) Foreign Application Priority Data

Feb. 22, 2023 (CN) ........................ 202310166695.X

(51) Int. Cl.
*G09G 3/3233* (2016.01)
*G09G 3/3266* (2016.01)
*G11C 19/28* (2006.01)

(52) U.S. Cl.
CPC ......... *G09G 3/3233* (2013.01); *G09G 3/3266* (2013.01); *G11C 19/287* (2013.01);
(Continued)

(58) Field of Classification Search
CPC ............... G09G 3/3233; G09G 3/3266; G09G 2300/0426; G09G 2300/0852;
(Continued)

(56) References Cited

U.S. PATENT DOCUMENTS

2023/0238496 A1* 7/2023 Bok ......................... G09G 3/32 257/79
2024/0135873 A1* 4/2024 Sun ...................... H10D 86/481

FOREIGN PATENT DOCUMENTS

CN 108597441 B 6/2020
CN 116030762 A 4/2023

* cited by examiner

*Primary Examiner* — Kenneth B Lee, Jr.
(74) *Attorney, Agent, or Firm* — WHDA, LLP

(57) ABSTRACT

A display baseplate includes a first gate driving circuit, a second gate driving circuit, and a plurality of pixel driving circuits arranged in array. The first gate driving circuit includes a plurality of first shift registers cascaded to each other, the second gate driving circuit includes a plurality of second shift registers cascaded to each other, and the plurality of pixel driving circuits include a first pixel driving circuit and a second pixel driving circuit located in different rows, a write control terminal of the first pixel driving circuit and a write control terminal of the second pixel driving circuit are connected to different first shift registers, and a compensation control terminal of the first pixel driving circuit and a compensation control terminal of the second pixel driving circuit are connected to a same second shift register.

20 Claims, 7 Drawing Sheets

(52) U.S. Cl.
CPC ............... *G09G 2300/0426* (2013.01); *G09G 2300/0852* (2013.01); *G09G 2310/0286* (2013.01); *G09G 2310/08* (2013.01); *G09G 2320/0233* (2013.01); *G09G 2320/0247* (2013.01)

(58) Field of Classification Search
CPC ....... G09G 2310/0286; G09G 2310/08; G09G 2320/0233; G09G 2320/0247; G11C 19/287
See application file for complete search history.

DISPLAY BASEPLATE AND DRIVING METHOD THEREOF, AND DISPLAY DEVICE

CROSS-REFERENCE TO RELATED APPLICATION

The present disclosure claims the priority of the Chinese patent application filed on Feb. 22, 2023 before the CNIPA, China National Intellectual Property Administration with the application number of 202310166695.X and the title of "DISPLAY BASEPLATE AND DRIVING METHOD THEREOF, AND DISPLAY DEVICE", which is incorporated herein in its entirety by reference.

TECHNICAL FIELD

The present disclosure relates to the technical field of display and more particularly, to a display baseplate and a driving method thereof, and a display device.

BACKGROUND

The Organic Light-Emitting Diode (OLED) screens have the advantages such as lightweight, high brightness, low power consumption, fast response, high clarity, good flexibility, and high luminous efficiency, which can meet new demands of the consumers for display technology.

SUMMARY

The present disclosure provides a display baseplate, including a substrate, as well as a first gate driving circuit, a second gate driving circuit, and a plurality of pixel driving circuits arranged in array, that are disposed on a side of the substrate; wherein the first gate driving circuit includes a plurality of first shift registers cascaded to each other, the second gate driving circuit includes a plurality of second shift registers cascaded to each other, and each of the plurality of pixel driving circuits includes:

a writing module, connected to a data terminal, a first node and a write control terminal, and configured for writing a signal of the data terminal to the first node according to a signal of the write control terminal;

a driver module, connected to the first node, a second node and a third node, and configured for writing a voltage of the first node to the third node according to a potential of the second node, wherein the third node is further connected to a light emitting device; and a compensation module, connected to the third node, the second node and a compensation control terminal, and configured for writing a signal of the third node to the second node according to a signal of the compensation control terminal;

wherein the plurality of pixel driving circuits include a first pixel driving circuit and a second pixel driving circuit located in different rows, a write control terminal of the first pixel driving circuit and a write control terminal of the second pixel driving circuit are connected to different first shift registers, and a compensation control terminal of the first pixel driving circuit and a compensation control terminal of the second pixel driving circuit are connected to a same second shift register; and the first pixel driving circuit is configured for driving a light emitting device of a first pixel to emit light, the second pixel driving circuit is configured for driving a light emitting device of a second pixel to emit light, and when a same signal is written to a data terminal of the first pixel driving circuit and a data terminal of the second pixel driving circuit, a difference in luminance between the first pixel and the second pixel is less than or equal to two gray levels.

In some implementations, a structure of the first pixel driving circuit is different from a structure of the second pixel driving circuit.

In some implementations, each of the plurality of pixel driving circuits further includes:

a first capacitor, wherein a first electrode plate of the first capacitor is connected to a first voltage terminal, a second electrode plate of the first capacitor is connected to the second node, and the first capacitor is configured for storing a signal of the second node;

wherein a capacitance value of a first capacitor in the first pixel driving circuit is different from a capacitance value of a first capacitor in the second pixel driving circuit.

In some implementations, the write control terminal of the first pixel driving circuit is connected to an output terminal of a first shift register at an nth stage, the write control terminal of the second pixel driving circuit is connected to an output terminal of a first shift register at an (n+i)th stage, and both n and i are positive integers greater than or equal to 1;

wherein the capacitance value of the first capacitor in the first pixel driving circuit is greater than the capacitance value of the first capacitor in the second pixel driving circuit.

In some implementations, the first electrode plate of the first capacitor is provided with an opening, and an orthographic projection of the opening on the substrate is located in a range of an orthographic projection of the second electrode plate of the first capacitor on the substrate;

wherein an area of an orthographic projection of an opening in the first pixel driving circuit on the substrate is less than an area of an orthographic projection of an opening in the second pixel driving circuit on the substrate.

In some implementations, the driver module includes:

a first transistor, wherein a control electrode of the first transistor is connected to the second node, a first electrode of the first transistor is connected to the first node, and a second electrode of the first transistor is connected to the third node;

wherein a channel width-to-length ratio of a first transistor in the first pixel driving circuit is different from a channel width-to-length ratio of a first transistor in the second pixel driving circuit.

In some implementations, the write control terminal of the first pixel driving circuit is connected to an output terminal of a first shift register at an nth stage, the write control terminal of the second pixel driving circuit is connected to an output terminal of a first shift register at an (n+i)th stage, and both n and i are positive integers greater than or equal to 1;

wherein the channel width-to-length ratio of the first transistor in the first pixel driving circuit is less than the channel width-to-length ratio of the first transistor in the second pixel driving circuit.

In some implementations, a structure of the first pixel driving circuit is the same as a structure of the second pixel driving circuit.

In some implementations, each of the plurality of pixel driving circuits further includes:

a first reset module, connected to a reset control terminal, a first reset terminal and a fourth node, and configured for writing a signal of the first reset terminal to the fourth node according to a signal of the reset control terminal, wherein the fourth node is further connected to a first electrode of the light emitting device; and a second capacitor, wherein a first electrode plate of the second capacitor is connected to the first node, and a second electrode plate of the second capacitor is connected to the fourth node;

wherein the write control terminal of the first pixel driving circuit is connected to an output terminal of a first shift register at an nth stage, an reset control terminal of the first pixel driving circuit is connected to an output terminal of a first shift register at an (n+x)th stage, the write control terminal of the second pixel driving circuit is connected to an output terminal of a first shift register at an (n+i)th stage, a reset control terminal of the second pixel driving circuit is connected to an output terminal of a first shift register at an (n+i+x)th stage, and all n, x and i are positive integers greater than or equal to 1.

In some implementations, x is greater than or equal to 2, and less than or equal to 10.

In some implementations, the compensation module includes:

a second transistor, wherein a control electrode of the second transistor is connected to the compensation control terminal, a first electrode of the second transistor is connected to the third node, and a second electrode of the second transistor is connected to the second node;

the writing module includes: a third transistor, wherein a control electrode of the third transistor is connected to the write control terminal, a first electrode of the third transistor is connected to the data terminal, and a second electrode of the third transistor is connected to the first node;

wherein the second transistor includes an oxide transistor, and the third transistor includes a polycrystalline silicon transistor.

In some implementations, the first pixel driving circuit is located in an odd row, and the second pixel driving circuit is located in an even row adjacent to the odd row.

The present disclosure provides a display device, including: the light emitting device, and the display baseplate according to any one of the above implementations, wherein the display baseplate is connected to the light emitting device, and configured for driving the light emitting device to emit light.

The present disclosure provides a driving method, applied to the display baseplate according to any one of the above implementations, and the driving method includes:

controlling the first gate driving circuit to output a first write control signal to the write control terminal of the first pixel driving circuit, and to output a second write control signal to the write control terminal of the second pixel driving circuit, and controlling the second gate driving circuit to output a compensation control signal to the compensation control terminal of the first pixel driving circuit and the compensation control terminal of the second pixel driving circuit, so that the first pixel driving circuit writes a signal from the data terminal of the first pixel driving circuit to a second node of the first pixel driving circuit, and the second pixel driving circuit writes a signal from the data terminal of the second pixel driving circuit to a second node of the second pixel driving circuit, wherein within one frame period, a pulse duration of the compensation control signal covers a pulse duration of the first write control signal and a pulse duration of the second write control signal, and the pulse duration of the first write control signal does not overlap with the pulse duration of the second write control signal.

In some implementations, within one frame period, the pulse duration of the first write control signal precedes the pulse duration of the second write control signal, a duration between a pulse trailing edge of the compensation control signal and a pulse trailing edge of the first write control signal is a first duration, a duration between the pulse trailing edge of the compensation control signal and the pulse trailing edge of the second write control signal is a second duration, and a ratio of a difference between the first duration and the second duration to the first duration is less than or equal to ⅛.

In some implementations, the difference between the first duration and the second duration is 1H, the first duration is greater than or equal to 8H, and His a duration required for the display baseplate to scan one row of the pixel driving circuits.

In some implementations, a pulse width of the first write control signal is different from a pulse width of the second write control signal.

In some implementations, within one frame period, the pulse duration of the first write control signal precedes the pulse duration of the second write control signal, and the pulse width of the first write control signal is less than the pulse width of the second write control signal.

In some implementations, before the step of controlling the first gate driving circuit to output a first write control signal to the write control terminal of the first pixel driving circuit, and to output a second write control signal to the write control terminal of the second pixel driving circuit, the method further includes:

providing a first clock signal and a second clock signal to the first gate driving circuit, so that the first gate driving circuit generates the first write control signal according to the first clock signal, and generates the second write control signal according to the second clock signal, wherein a duty cycle of the first clock signal is less than a duty cycle of the second clock signal.

In some implementations, when each of the plurality of pixel driving circuits further includes a first reset module and a second capacitor, the first reset module is connected to a reset control terminal, a first reset terminal and a fourth node, the fourth node is further connected to a first electrode of the light emitting device, a first electrode plate of the second capacitor is connected to the first node, and a second electrode plate of the second capacitor is connected to the fourth node, the write control terminal of the first pixel driving circuit is connected to an output terminal of a first shift register at an nth stage, an reset control terminal of the first pixel driving circuit is connected to an output terminal of a first shift register at an (n+x)th stage, the write control terminal of the second pixel driving circuit is connected to an output terminal of a first shift register at an (n+i)th stage, a reset control terminal of the second pixel driving circuit is connected to an output terminal of a first shift register at an (n+i+x)th stage, and all n, x and i are positive integers greater than or equal to 1, after the step of controlling the first gate driving circuit to output a first write control signal to the write control terminal of the first pixel driving circuit, and to output a second write control signal to the write control terminal of the second pixel driving circuit, the method further includes:

controlling the first gate driving circuit to output a first reset control signal to the reset control terminal of the first pixel driving circuit, and to output a second reset control signal to the reset control terminal of the second pixel driving circuit, wherein within one frame period, the pulse duration of the compensation control signal covers a pulse duration of the first reset control signal and a pulse duration of the second reset control signal, and the pulse duration of the first reset control signal does not overlap with the pulse duration of the second reset control signal.

The above description is merely a summary of the technical solutions of the present disclosure. In order to more clearly know the technical means of the present disclosure to enable the implementation according to the contents of the description, and in order to make the above and other purposes, features and advantages of the present disclosure more apparent and understandable, the particular embodiments of the present disclosure are provided below.

BRIEF DESCRIPTION OF THE DRAWINGS

In order to more clearly illustrate the technical solutions of the embodiments of the present disclosure or the related art, the figures that are required to describe the embodiments or the related art will be briefly described below. Apparently, the figures that are described below are embodiments of the present disclosure, and a person skilled in the art can obtain other figures according to these figures without paying creative work. It should be noted that the scale in the attached figures is only for illustration and does not represent the actual scale.

DETAILED DESCRIPTION

In order to make the purpose, technical solution, and advantages of the embodiment of the present disclosure clearer, the technical solutions according to the embodiments of the present disclosure will be clearly and completely described below with reference to the drawings of the present disclosure. Apparently, the described embodiments are merely certain embodiments of the present disclosure, rather than all of the embodiments. All of the other embodiments that a person skilled in the art obtains on the basis of the embodiments of the present disclosure without paying creative work fall within the protection scope of the present disclosure.

Figure 1:
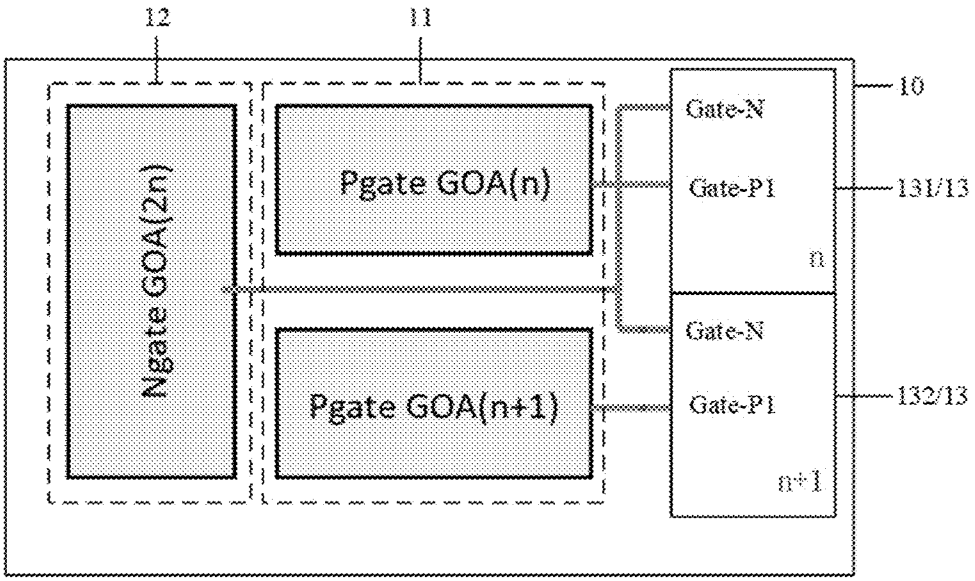
FIG. 1 shows a schematic structural diagram of a display baseplate according to the disclosure.

FIG. 1 shows a schematic structural diagram of a display baseplate according to the disclosure, as shown in FIG. 1, the display baseplate includes: a substrate 10, as well as a first gate driving circuit 11, a second gate driving circuit 12, and a plurality of pixel driving circuits 13 arranged in array, that are disposed on a side of the substrate 10.

As shown in FIG. 1, the first gate driving circuit 11 includes a plurality of first shift registers Pgate GOA cascaded to each other, the second gate driving circuit 12 includes a plurality of second shift registers Ngate GOA (FIG. 1 only shows one) cascaded to each other.

Figure 2:
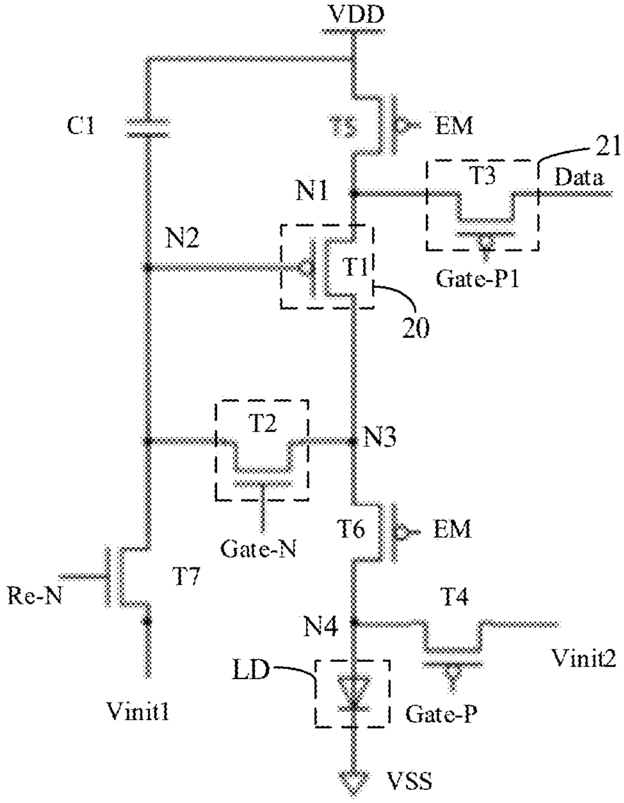
FIG. 2 shows a schematic diagram of a circuit structure of a first type of pixel driving circuit.

FIG. 2 shows a schematic diagram of a circuit structure of a first type of pixel driving circuit, and this pixel driving circuit 13 includes: a writing module 21, connected to a data terminal Data, a first node N1 and a write control terminal Gate-P1, and configured for writing a signal of the data terminal Data to the first node N1 according to a signal of the write control terminal Gate-P1; a driver module 20, connected to the first node N1, a second node N2 and a third node N3, and configured for writing a voltage of the first node N1 to the third node N3 according to a potential of the second node N2, wherein the third node N3 is further connected to a light emitting device LD; and a compensation module 22, connected to the third node N3, the second node N2 and a compensation control terminal Gate-N, and configured for writing a signal of the third node N3 to the second node N2 according to a signal of the compensation control terminal Gate-N.

As shown in FIG. 1, the plurality of pixel driving circuits 13 include a first pixel driving circuit 131 and a second pixel driving circuit 132 located in different rows. Among them, a write control terminal Gate-P1 of the first pixel driving circuit 131 and a write control terminal Gate-P1 of the second pixel driving circuit 132 are connected to different first shift registers Pgate GOA, and a compensation control terminal Gate-N of the first pixel driving circuit 131 and a compensation control terminal Gate-N of the second pixel driving circuit 132 are connected to a same second shift register Ngate GOA.

Among them, the write control terminal Gate-P1 of the pixel driving circuit 13 is connected to an output terminal of the first shift register Pgate GOA, and the compensation control terminal Gate-N of the pixel driving circuit 13 is connected to an output terminal of the second shift register Ngate GOA.

It should be noted that each second shift register Ngate GOA can have one or more output terminals, and multiple output terminals output the same signal. The compensation control terminal Gate-N of the first pixel driving circuit 131 and the compensation control terminal Gate-N of the second pixel driving circuit 132 can be connected to the same output terminal or different output terminals in the same second shift register Ngate GOA, which is not limited in the present disclosure.

Among them, the first gate driving circuit 11 is used to output the write control signal. Since the write control signal determines the effective charging time of the pixel driving circuit 13, as shown in FIG. 1, one first shift register Pgate GOA drives a row of pixel driving circuits 13, that is, the first gate driving circuit 11 adopts a 1 driving 1 architecture.

As shown in FIG. 1, the write control terminal Gate-P1 of the first pixel driving circuit 131 is connected to the output terminal of the first shift register at the nth stage Pgate GOA(n), and the write control terminal Gate-P1 of the second pixel driving circuit 132 is connected to the output terminal of the first shift register at the (n+i)th stage Pgate GOA(n+1). Both n and i are positive integers greater than or equal to 1. In FIG. 1, i=1.

The second gate driving circuit 12 is used to output compensation control signals. Due to the low requirements of the pixel driving circuit 13 for the rising edge and falling edge of the compensation control signals, in order to achieve the narrow border, as shown in FIG. 1, the compensation control terminal Gate-N of the first pixel driving circuit 131 and the compensation control terminal Gate-N of the second pixel driving circuit 132 are connected to the same second shift register Ngate GOA. That is, the second gate driving circuit 12 adopts a 1 driving M architecture, where M can be a positive integer greater than or equal to 2. In FIG. 1, one second shift register Ngate GOA (2*n*) drives two rows of pixel driving circuits 13 (i.e., the row to which the first pixel driving circuit 131 belongs and the row to which the second pixel driving circuit 132 belongs), that is, the second gate driving circuit 12 adopts a 1 driving 2 (i.e., M=2) architecture.

For example, as shown in FIG. 1, the first pixel driving circuit 131 is located in an odd row, such as the nth row (where n is an odd number), and the second pixel driving circuit 132 is located in an even row adjacent to the odd row, such as the (n+1)th row, which is not limited in the present disclosure.

The inventor found that, when the first gate driving circuit 11 adopts a 1 driving 1 architecture, the second gate driving circuit 12 adopts a 1 driving 2 architecture, and the odd rows where the first pixel driving circuits 131 are located and the even rows where the second pixel driving circuits 132 are located (hereinafter referred to as odd and even rows) display the same gray level, there is a difference in the display luminance of the pixels in the odd and even rows, manifested as fine horizontal-stripe defects.

Among them, the first pixel driving circuit is configured for driving a light emitting device LD1 (i.e., the first light emitting device LD1) of a first pixel to emit light, the second pixel driving circuit 132 is configured for driving a light emitting device LD2 (i.e., the second light emitting device LD2) of a second pixel to emit light. As shown in FIG. 2, when a same signal is written to a data terminal Data of the first pixel driving circuit 131 and a data terminal Data of the second pixel driving circuit 132, a difference in luminance between the first pixel and the second pixel is less than or equal to two gray levels, this can improve the fine horizontal-stripe defects.

For example, when the same signal is written to the data terminal Data of the first pixel driving circuit 131 and the data terminal Data of the second pixel driving circuit 132, the ratio of the difference between the luminous current of the first light emitting device LD1 and the luminous current of the second light emitting device LD2 to the luminous current of the first light emitting device LD1 is less than or equal to 0.4%. In this way, the luminance difference between the odd row and the even row can be reduced, thereby improving the fine horizontal-stripe defects.

For example, as shown in FIG. 2, the driver module 20 includes a first transistor T1, a control electrode of the first transistor T1 is connected to the second node N2, a first electrode of the first transistor T1 is connected to the first node N1, and a second electrode of the first transistor T1 is connected to the third node N3.

For example, as shown in FIG. 2, the compensation module 22 includes a second transistor T2, a control electrode of the second transistor T2 is connected to the compensation control terminal Gate-N, a first electrode of the second transistor T2 is connected to the third node N3, and a second electrode of the second transistor T2 is connected to the second node N2.

For example, as shown in FIG. 2, the writing module 21 includes a third transistor T3, a control electrode of the third transistor T3 is connected to the write control terminal Gate-P1, a first electrode of the third transistor T3 is connected to the data terminal Data, and a second electrode of the third transistor T3 is connected to the first node N1.

For example, the second transistor T2 includes an oxide transistor, the oxide transistor can be, for example, an Indium Gallium Zinc Oxide (IGZO) transistor. Due to the low leakage characteristics of the oxide transistor, the problem of low-frequency flicker can be improved, allowing the display baseplate to operate in a low-frequency state, which is beneficial for reducing system power consumption and improving display screen endurance.

Due to the high mobility characteristics of polycrystalline silicon transistors, the charging rate can be improved. For example, the third transistor T3 can be a polycrystalline silicon transistor, such as a low-temperature polycrystalline silicon transistor.

For example, as shown in FIG. 2, the first transistor T1 and the third transistor T3 are P-type transistors, and the second transistor T2 is an N-type transistor.

Figure 3:
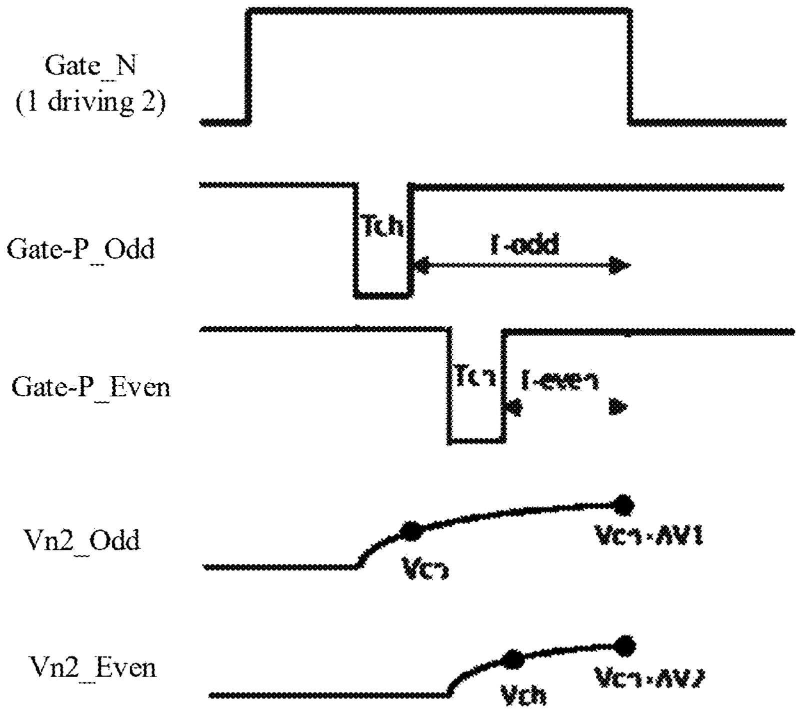
FIG. 3 shows a timing diagram of a first type of driving signal of the first type of pixel driving circuit.

In specific implementation, the first pixel driving circuit 131 can be controlled to output write control signals step by step from the first stage first shift register at a first stage Pgate GOA. Among them, the first shift register at the nth stage Pgate GOA(n) outputs a first write control signal (such as Gate-P_Odd shown in FIG. 3) to the write control terminal Gate-P1 of the first pixel driving circuit 131, and the first shift register at the (n+1)th stage Pgate GOA(n+1) outputs a second write control signal (such as Gate-P_Even shown in FIG. 3) to the write control terminal Gate-P1 of the second pixel driving circuit 132. As shown in FIG. 3, within one frame period, the pulse duration of the first write control signal Gate-P_Odd does not overlap with the pulse duration of the second write control signal Gate-P_Even, and the pulse duration of the first write control signal Gate-P_Odd is 1H earlier than the pulse duration of the second write control signal Gate-P Even.

In specific implementation, the second shift register Ngate GOA (2*n*) of the second gate driving circuit 12 can be controlled to output compensation control signals to the compensation control terminal Gate-N of the first pixel driving circuit 131 and the compensation control terminal Gate-N of the second pixel driving circuit 132. Since the second gate driving circuit 12 adopts the 1 driving 2 architecture, during the data writing phase and threshold compensation phase within one frame period, the pulse duration (such as the high-level time of Gate-N shown in FIG. 3) of the compensation control signal Gate-N output by the second gate driving circuit 12 needs to cover the pulse durations (such as the low-level time of Gate-P_Odd and Gate-P_Even shown in FIG. 3) of two signals, i.e., the first write control signal (such as Gate-P_Odd shown in FIG. 3) and the second write control signal (such as Gate-P_Even shown in FIG. 3).

The inventor analyzed the formation mechanism of the fine horizontal-stripe defects. Taking the 7T1C pixel driving circuit 13 shown in FIG. 2 as an example, for the first pixel driving circuit 131, as shown in FIG. 3, the low-level time in the first write control signal Gate-P_Odd is the effective charging time Tch. At the end of the effective charging time, the gate of the first transistor T1 (i.e., the second node N2) is charged to a potential Vn2-Odd of Vch. When the first write control signal Gate-P_Odd jumps to a high level, the third transistor T3 is turned off. Since the compensation control signal Gate-N is still at a high potential, the second transistor T2 is still in an open state. The residual voltage of the first node N1 will continue to charge the second node N2 and obtain the threshold of the first transistor T1. This period of time is the supplementary charging duration. The supplementary charging duration (such as T-odd shown in FIG. 3) of the first pixel driving circuit 131 is the first duration, which is the duration between the pulse trailing edge of the first write control signal Gate-P_Odd and the pulse trailing edge of the compensation control signal Gate-N.

Similarly, for the second pixel driving circuit 132, as shown in FIG. 3, the low-level time in the second write control signal Gate-P_Even is the effective charging time Tch. At the end of the effective charging time, the gate of the first transistor T1 (i.e., the second node N2) is charged to a potential Vn2-Even of Vch. When the second write control signal Gate-P_Even jumps to a high level, the third transistor T3 is turned off. Since the compensation control signal Gate-N is still at the high potential, the second transistor T2 is still in the open state. The residual voltage of the first node N1 will continue to charge the second node N2 and obtain the threshold of the first transistor T1. This period of time is the supplementary charging duration. The supplementary charging duration (such as T-even shown in FIG. 3) of the second pixel driving circuit 132 is the second duration, which is the duration between the pulse trailing edge of the second write control signal Gate-P_Even and the pulse trailing edge of the compensation control signal Gate-N.

Referring to FIG. 3, due to the phase difference of 1H between the first write control signal Gate-P_Odd and the second write control signal Gate-P_Even, that is, the pulse duration of the first write control signal Gate-P_Odd is 1H earlier than the pulse duration of the second write control signal Gate-P_Even. Therefore, the supplementary charging duration T-odd of the first pixel driving circuit 131 is 1H longer than the supplementary charging duration T-even of the second pixel driving circuit 132. In the case where the same signal Vdt is written to the data terminal Data of the first pixel driving circuit 131 and the data terminal Data of the second pixel driving circuit 132, the final charged potential Vn2-Odd at the second node N2 in the first pixel driving circuit 131 is Vch+$\Delta$V1, the final charged potential Vn2-Even at the second node N2 in the second pixel driving circuit 132 is Vch+$\Delta$V2, and $\Delta$V1>$\Delta$V2. From this, it can be seen that due to the different actual charging times of the first pixel driving circuit 131 and the second pixel driving circuit 132 for the second node N2, the final charging potentials of the second node N2 are different, which ultimately leads to a difference in luminance of the first light emitting device LD1 and the second light emitting device LD2, resulting in the fine horizontal-stripe defects.

It should be noted that His a duration required for the display baseplate to scan one row of the pixel driving circuits 13.

In some implementations, a structure of the first pixel driving circuit 131 is different from a structure of the second pixel driving circuit 132, which may specifically include the following situations: the circuit connection structure of the first pixel driving circuit 131 being different from that of the second pixel driving circuit 132, and the circuit connection structure of the first pixel driving circuit 131 being the same as that of the second pixel driving circuit 132 (such as the circuit connection structure shown in FIG. 2), but one or more components in the circuit connection structure are different.

In order to make the structure of the first pixel driving circuit 131 different from that of the second pixel driving circuit 132, in the first implementation, as shown in FIG. 2, the pixel driving circuit 13 further includes a first capacitor C1, a first electrode plate of the first capacitor C1 is connected to a first voltage terminal VDD, a second electrode plate of the first capacitor C1 is connected to the second node N2, and the first capacitor C1 is configured for storing a signal of the second node N2. Among them, a capacitance value of a first capacitor C1 in the first pixel driving circuit 131 is different from a capacitance value of a first capacitor C1 in the second pixel driving circuit 132.

For example, both the first pixel driving circuit 131 and the second pixel driving circuit 132 have the circuit connection structures shown in FIG. 2, and the first capacitor C1 located in the first pixel driving circuit 131 and the first capacitor C1 located in the second pixel driving circuit 132 have different capacitance values.

By setting the capacitance values of the first capacitors C1 to be different, the charging speeds of the first pixel driving circuit 131 and the second pixel driving circuit 132 to the second node N2 are different, so as to offset or balance the actual charging time difference between the two for the second node N2, reduce or eliminate the final charging potential difference between the second nodes N2 in the first pixel driving circuit 131 and the second pixel driving circuit 132, reduce or eliminate the difference in luminous current and luminance between the first light emitting device LD1 and the second light emitting device LD2, and improve or eliminate the fine horizontal-stripe defects.

Further, as shown in FIG. 1, the write control terminal Gate-P1 of the first pixel driving circuit 131 is connected to an output terminal of a first shift register at an nth stage Pgate GOA(n), the write control terminal Gate-P1 of the second pixel driving circuit 132 is connected to an output terminal of a first shift register at an (n+i)th stage Pgate GOA (Pgate GOA(n+1) in FIG. 1, corresponding to i=1), and both n and i are positive integers greater than or equal to 1. In this way, within one frame period, the pulse duration of the first write control signal (Gate-P_Odd shown in FIG. 3) is iH earlier than the pulse duration of the second write control signal (Gate-P_Even shown in FIG. 3), and the supplementary charging duration T-odd of the first pixel driving circuit 131 is iH longer than the supplementary charging duration T-even of the second pixel driving circuit 132. In this case, the capacitance value of the first capacitor C1 in the first pixel driving circuit 131 may be greater than the capacitance value of the first capacitor C1 in the second pixel driving circuit 132.

In specific implementation, the display baseplate provided by this implementation can be driven by the signal timing as shown in FIG. 3. In FIG. 3, the pulse width of the first write control signal (Gate-P_Odd shown in FIG. 3) is the same as that of the second write control signal (Gate-P_Even shown in FIG. 3). The supplementary charging duration T-even of the second pixel driving circuit 132 is 1H (or 2H, 3H, etc.), and the supplementary charging duration of the first pixel driving circuit 131 is T-odd=T-even+1H (corresponding to i=1), such as 2H (or 3H, 4H, etc.).

By setting the first capacitor C1 with a larger capacitance value in the first pixel driving circuit 131, the charging speed of the first pixel driving circuit 131 to the second node N2 can be reduced, ultimately reducing or eliminating the final charging potential difference between the second nodes N2 in the first pixel driving circuit 131 and the second pixel driving circuit 132, thereby reducing or eliminating the luminance difference between the odd row and the even row.

For example, the capacitance value of the first capacitor C1 in the first pixel driving circuit 131 may be 65 fF, and the capacitance value of the first capacitor C1 in the second pixel driving circuit 132 may be 60 fF, which is not limited in the present disclosure.

Figure 4:
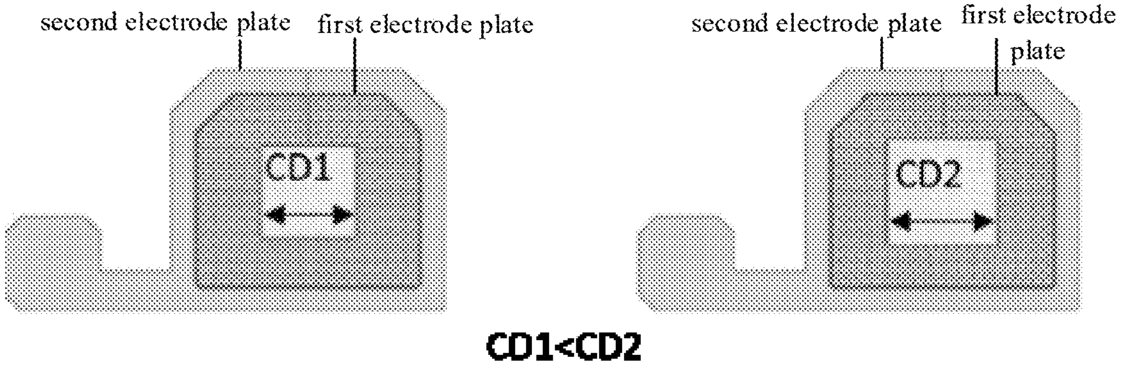
FIG. 4 shows a schematic diagram of planar structures of first capacitors in a first pixel driving circuit and a second pixel driving circuit.

For example, as shown in FIG. 4, the first electrode plate of the first capacitor C1 is provided with an opening, and an orthographic projection of the opening on the substrate 10 is located in a range of an orthographic projection of the second electrode plate of the first capacitor C1 on the substrate 10; an area of an orthographic projection of an opening in the first pixel driving circuit 131 on the substrate 10 is less than an area of an orthographic projection of an opening in the second pixel driving circuit 132 on the substrate 10.

For example, as shown in FIG. 4, a shape of the orthographic projection of the opening on the substrate 10 is a square, and the side length CD1 of the square opening in the first pixel driving circuit 131 is less than the side length CD2 of the square opening in the second pixel driving circuit 132.

It should be noted that the overlapping area of the two electrode plates of the first capacitor C1 in the first pixel driving circuit 131 can also be increased by increasing the area of the orthographic projection of the first electrode plate and/or the second plate of the first capacitor C1 in the first pixel driving circuit 131 on the substrate 10, thereby achieving that the capacitance value of the first capacitor C1 in the first pixel driving circuit 131 is greater than that of the first capacitor C1 in the second pixel driving circuit 132.

In order to make the structure of the first pixel driving circuit 131 different from that of the second pixel driving circuit 132, in the second implementation, as shown in FIG. 2, a channel width-to-length ratio of a first transistor T1 in the first pixel driving circuit 131 is different from a channel width-to-length ratio of a first transistor T1 in the second pixel driving circuit 132.

For example, both the first pixel driving circuit 131 and the second pixel driving circuit 132 have the circuit connection structure as shown in FIG. 2, and the channel width-to-length ratio of the first transistor T1 in the first pixel driving circuit 131 is different from the channel width-to-length ratio of the first transistor T1 in the second pixel driving circuit 132.

By setting the channel width-to-length ratio of the first transistors T1 to be different, the first pixel driving circuit 131 and the second pixel driving circuit 132 have different charging currents when charging the second node N2, which can offset or balance the actual charging time difference between the two for the second node N2, reduce or eliminate the final charging potential difference between the second nodes N2 in the first pixel driving circuit 131 and the second pixel driving circuit 132, reduce or eliminate the difference in luminous current and luminance between the first light emitting device LD1 and the second light emitting device LD2, and improve or eliminate the fine horizontal-stripe defects.

Furthermore, as shown in FIG. 1, the write control terminal Gate-P1 of the first pixel driving circuit 131 is connected to an output terminal of a first shift register at an nth stage Pgate GOA(n), the write control terminal Gate-P1 of the second pixel driving circuit 132 is connected to an output terminal of a first shift register at an (n+i)th stage Pgate GOA (Pgate GOA(n+1) shown in FIG. 1, corresponding i=1), and both n and i are positive integers greater than or equal to 1. In this way, within one frame period, the pulse duration of the first write control signal (Gate-P_Odd shown in FIG. 3) is iH earlier than the pulse duration of the second write control signal (Gate-P_Even shown in FIG. 3), and the supplementary charging duration T-odd of the first pixel driving circuit 131 is iH longer than the supplementary charging duration T-even of the second pixel driving circuit 132. In this case, the channel width-to-length ratio of the first transistor T1 in the first pixel driving circuit 131 is less than the channel width-to-length ratio of the first transistor T1 in the second pixel driving circuit 132.

In specific implementation, the display baseplate provided in this embodiment can also be driven using signal timing as shown in FIG. 3. By setting the channel width-to-length ratio of the first transistor T1 in the first pixel driving circuit 131 to be less than the channel width-to-length ratio of the first transistor T1 in the second pixel driving circuit 132, the charging current of the first pixel driving circuit 131 can be reduced, ultimately reducing or eliminating the final charging potential difference between the second nodes N2 in the first pixel driving circuit 131 and the second pixel driving circuit 132, thereby reducing or eliminating the luminance difference between the odd row and the even row.

In specific implementation, in order to reduce the channel width-to-length ratio of the first transistor T1 in the first pixel driving circuit 131, the channel width w1 of the first transistor T1 in the first pixel driving circuit 131 can be reduced, or the channel length of the first transistor T1 in the first pixel driving circuit 131 can be increased.

Figure 5:
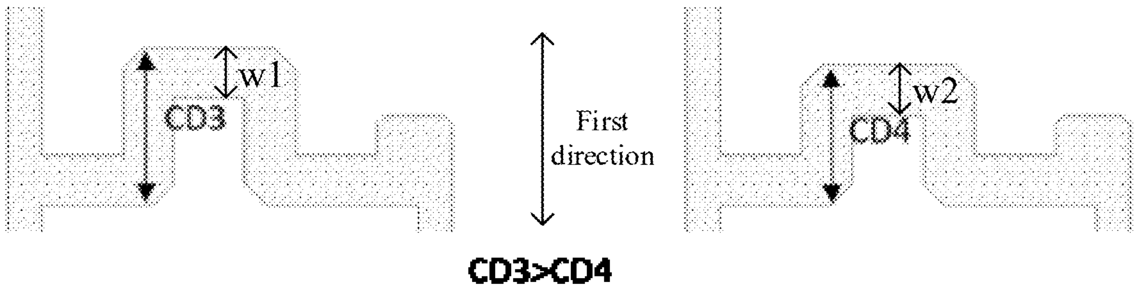
FIG. 5 shows a schematic diagram of planar structures of first transistor channels in the first pixel driving circuit and the second pixel driving circuit.

For example, as shown in FIG. 5, the channel length of the first transistor T1 includes the length of the channel of the first transistor T1 in the first direction. For example, in the first direction, the channel length CD3 of the first transistor T1 in the first pixel driving circuit 131 is greater than the channel length CD4 of the first transistor T1 in the second pixel driving circuit 132. Ultimately, it can be achieved that the channel length of the first transistor T1 in the first pixel driving circuit 131 is greater than the channel length of the first transistor T1 in the second pixel driving circuit 132.

For example, the channel width w1 of the first transistor T1 in the first pixel driving circuit 131 is 3 μm, the channel length is 25 μm, and the width-to-length ratio is 3/25. The channel width w2 of the first transistor T1 in the second pixel driving circuit 132 is 3 μm, the channel length is 21 μm, and the width-to-length ratio is 3/21.

In some implementations, the structure of the first pixel driving circuit 131 is the same as that of the second pixel driving circuit 132. For example, the circuit connection structure of the first pixel driving circuit 131 and the second pixel driving circuit 132 is the same (the two identical circuit connection structures shown in FIG. 6), and the component structures in this circuit connection structure are also the same.

Figure 6:
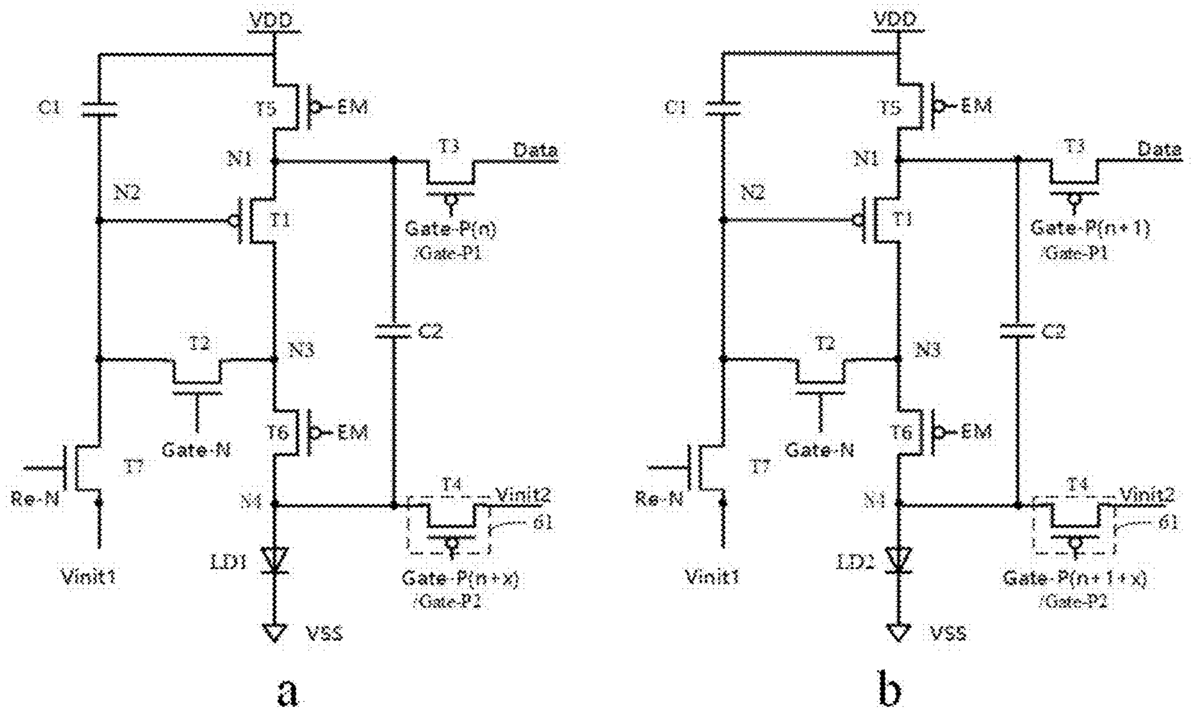
FIG. 6 shows a schematic diagram of circuit structures of two second type of pixel driving circuits.

In some implementations, as shown in FIG. 6, the pixel driving circuit 13 further includes: a first reset module 61, connected to a reset control terminal Gate-P2, a first reset terminal Vinit2 and a fourth node N4, and configured for writing a signal of the first reset terminal Vinit2 to the fourth node N4 according to a signal of the reset control terminal Gate-P2, wherein the fourth node N4 is further connected to a first electrode of the light emitting device LD; and a second capacitor C2, wherein a first electrode plate of the second capacitor C2 is connected to the first node N1, and a second electrode plate of the second capacitor C2 is connected to the fourth node N4.

For example, as shown in FIG. 6, the first reset module 61 includes a fourth transistor T4, a control electrode of the fourth transistor T4 is connected to the reset control terminal Gate-P2, a first electrode of the fourth transistor T4 is connected to the first reset terminal Vinit2, and a second electrode of the fourth transistor T4 is connected to the fourth node N4.

For example, as shown in FIG. 6, the fourth transistor T4 is a P-type transistor.

In order to reduce the luminance difference between the odd row and the even row, in some implementations, as shown in plan a of FIG. 6, the write control terminal Gate-P1 of the first pixel driving circuit 131 is connected to an output terminal of a first shift register at an nth stage Pgate GOA(n), a reset control terminal Gate-P2 of the first pixel driving circuit 131 is connected to an output terminal of a first shift register at an (n+x)th stage Pgate GOA(n+x). As shown in plan b of FIG. 6, the write control terminal Gate-P1 of the second pixel driving circuit 132 is connected to an output terminal of a first shift register at an (n+i)th stage Pgate GOA(n+i), a reset control terminal Gate-P2 of the second pixel driving circuit 132 is connected to an output terminal of a first shift register at an (n+i+x)th stage Pgate GOA(n+i+x), and all n, x and i are positive integers greater than or equal to 1. In FIG. 6, i=1.

Figure 7:
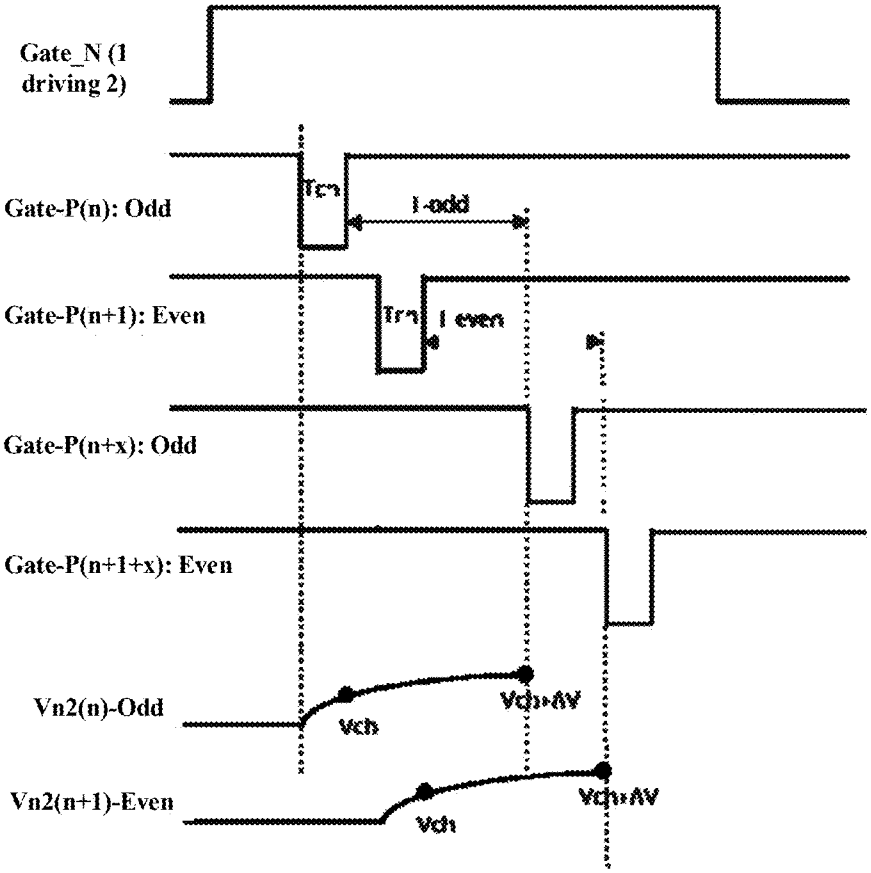
FIG. 7 shows a timing diagram of driving signals of the second type of pixel driving circuit.

In specific implementation, referring to FIG. 6 and FIG. 7, the first shift register at the nth stage Pgate GOA(n) can be controlled to output the first write control signal (Gate-P(n)_Odd shown in FIG. 7) to the write control terminal Gate-P1 of the first pixel driving circuit 131, the first shift register at the (n+x)th stage Pgate GOA(n+x) is controlled to output a first reset control signal (Gate-P(n+x)_Odd shown in FIG. 7) to the reset control terminal Gate-P2 of the first pixel driving circuit 131, the first shift register at a (n+1)th stage Pgate GOA(n+1) is controlled to output a second write control signal (Gate-P(n+1)_Even shown in FIG. 7) to the write control terminal Gate-P1 of the second pixel driving circuit 132, and the first shift register at the (n+1+x)th stage Pgate GOA(n+1+x) is controlled to output a second reset control signal (Gate-P(n+1+x)_Even shown in FIG. 7) to the reset control terminal Gate-P2 of the second pixel driving circuit 132.

For the first pixel driving circuit 131, the low-level time of the first write control signal (Gate-P(n)_Odd shown in FIG. 7) is the effective charging time Tch. At the end of the effective charging time, the gate (i.e., the second node N2) of the first transistor T1 is charged to a potential Vn2 (*n*)-Odd of Vch, the potential of the first node N1 is Vdt, and the potential of the fourth node N4 is Vss+Voled. When the first write control signal (Gate-P(n)_Odd shown in FIG. 7) jumps to a high level, the third transistor T3 is turned off. Since the compensation control signal (Gate-N shown in FIG. 7) is still at the high level, the second transistor T2 is still in the open state. The residual voltage of the first node N1 will continue to charge the second node N2 and obtain the threshold of the first transistor T1, and enter to the supplementary charging stage until the first reset control signal (Gate-P(n+x)_Odd shown in FIG. 7) jumps to a low level, and the potential of the fourth node N4 jumps from Vss+Voled to the first reset signal Vinit2. Due to the coupling effect of the second capacitor C2, the potential change of the fourth node N4 can lower the potential of the first node N1 which is in a suspended state. The potential change of the first node N1 is ΔVn1=(C2/Cn1_all)*[Vinit2−(Vss+Voled)]. Among them, Cn1_all is the sum of all capacitance values of the first node N1. When the potential of the first node N1 is lower than Vdt, it is impossible to continue charging the second node N2, and the second node N2 maintains the potential before the first reset control signal jumps.

Similarly, for the second pixel driving circuit 132, the low-level time of the second write control signal (Gate-P(n+1)_Even shown in FIG. 7) is the effective charging time Tch. At the end of the effective charging time, the gate (i.e., the second node N2) of the first transistor T1 is charged to a potential Vn2 (n+1)-Even of Vch, the potential of the first node N1 is Vdt, and the potential of the fourth node N4 is Vss+Voled. When the second write control signal (Gate-P(n+1)_Even shown in FIG. 7) jumps to a high level, the third transistor T3 is turned off. Since the compensation control signal (Gate-N shown in FIG. 7) is still at the high level, the second transistor T2 is still in the open state. The residual voltage of the first node N1 will continue to charge the second node N2 and obtain the threshold of the first transistor T1, and enter to the supplementary charging stage until the second reset control signal (Gate-P(n+1+x)_Even shown in FIG. 7) jumps to a low level, and the potential of the fourth node N4 jumps from Vss+Voled to the first reset signal Vinit2. Due to the coupling effect of the second capacitor C2, the potential change of the fourth node N4 can lower the potential of the first node N1 which is in the suspended state. The potential change of the first node N1 is ΔVn1=(C2/Cn1_all)*[Vinit2−(Vss+Voled)]. Among them, Cn1_all is the sum of all capacitance values of the first node N1. When the potential of the first node N1 is lower than Vdt, it is impossible to continue charging the second node N2, and the second node N2 maintains the potential before the first reset control signal jumps.

Therefore, the supplementary charging duration T-even of the second pixel driving circuit 132 is the duration between the pulse trailing edge of the second write control signal (Gate-P(n+1)_Even shown in FIG. 7) and the pulse leading edge of the second reset control signal (Gate-P(n+1+x)_Even shown in FIG. 7), which is also equal to xH. The final charging potential Vn2(*n*+1)−Even of the second node N2 in the second pixel driving circuit 132 is also Vch+ΔV.

In specific implementation, as shown in FIG. 7, the pulse width of the first write control signal Gate-P_Odd and the pulse width of the second write control signal Gate-P_Even can be the same, that is, the effective charging time of the first pixel driving circuit 131 and the effective charging time of the second pixel driving circuit 132 are the same. Since the supplementary charging duration of the first pixel driving circuit 131 and the supplementary charging duration of the second pixel driving circuit 132 are also the same, the pixel driving circuit shown in FIG. 6 can completely eliminate the final charging potential difference of the second nodes N2 in the first pixel driving circuit 131 and the second pixel driving circuit 132, thereby significantly reducing or eliminating the luminance difference between the odd row and the even row.

As shown in FIG. 7, within one frame period, a pulse duration of the compensation control signal further covers a pulse duration of the first reset control signal and a pulse duration of the second reset control signal. In addition, the pulse duration of the first write control signal may not overlap with the pulse duration of the second write control signal, and the pulse duration of the first reset control signal may not overlap with the pulse duration of the second reset control signal.

In some implementations, x is greater than or equal to 2, and less than or equal to 10. For example, x may be equal to 3, 5, or 7 and so on.

By increasing the value of x, the phase difference between the write control signal and the reset control signal can be widened, effectively extending the supplementary charging duration and improving the problems of insufficient charging and low gray-level image quality. In specific implementation, the specific value of x can be determined based on factors such as actual display effect and wiring space.

The present disclosure provides a display device, including: the light emitting device, and the display baseplate according to any one of the implementations. Among them, the display baseplate is connected to the light emitting device, and configured for driving the light emitting device to emit light.

It can be understood that the display device provided in the present disclosure has the advantages of the display baseplate mentioned above, which will not be repeated here. The display device provided in the present disclosure can be any product or component with display function, such as a display panel, mobile phone, tablet computer, television, monitor, laptop computer, digital photo frame or navigation device.

Among them, the pixel driving circuit 13 in the display baseplate is connected to the light emitting device to provide luminous current for the light emitting device.

The present disclosure provides a driving method, applied to the display baseplate according to any one of the implementations, and the driving method includes:

Step S01: controlling the first gate driving circuit 11 to output a first write control signal to the write control terminal Gate-P1 of the first pixel driving circuit 131, and to output a second write control signal to the write control terminal Gate-P1 of the second pixel driving circuit 132, and controlling the second gate driving circuit 12 to output a compensation control signal to the compensation control terminal Gate-N of the first pixel driving circuit 131 and the compensation control terminal Gate-N of the second pixel driving circuit 132, so that the first pixel driving circuit 131 writes a signal from the data terminal Data of the first pixel driving circuit 131 to a second node N2 of the first pixel driving circuit 131, and the second pixel driving circuit 132 writes a signal from the data terminal Data of the second pixel driving circuit 132 to a second node N2 of the second pixel driving circuit 132. Among them, within one frame period, a pulse duration of the compensation control signal covers a pulse duration of the first write control signal and a pulse duration of the second write control signal, and the pulse duration of the first write control signal does not overlap with the pulse duration of the second write control signal.

Figure 8:
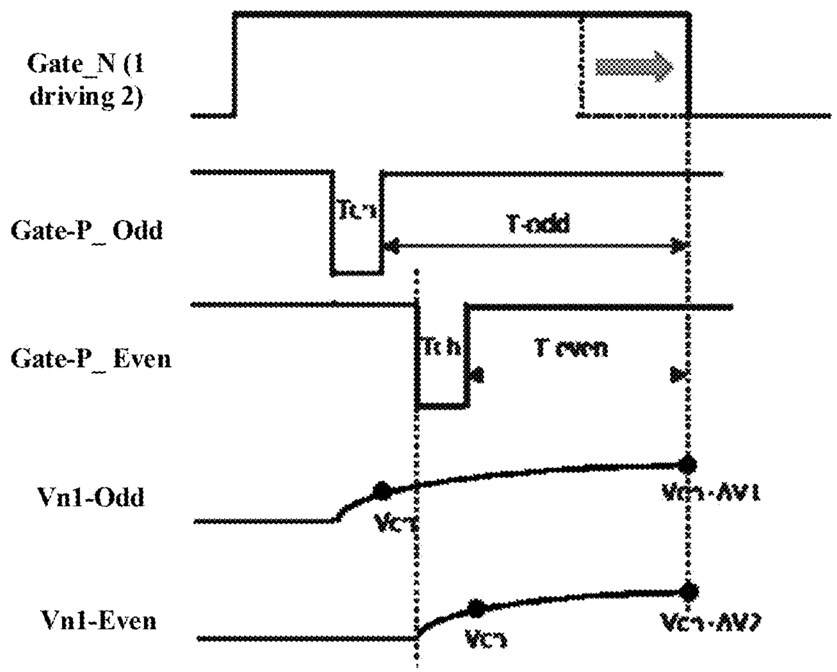
FIG. 8 shows a timing diagram of a second type of driving signal of the first type of pixel driving circuit.

In order to reduce the luminance difference between the odd row and the even row, in some implementations, as shown in FIG. 8, within one frame period, the pulse duration of the first write control signal Gate-P_Odd precedes the pulse duration of the second write control signal Gate-P_Even, a duration between a pulse trailing edge of the compensation control signal Gate-N and a pulse trailing edge of the first write control signal Gate-P_Odd is a first duration T-odd, a duration between the pulse trailing edge of the compensation control signal Gate-N and the pulse trailing edge of the second write control signal Gate-P_Even is a second duration T-even, and a ratio of a difference between the first duration T-odd and the second duration T-even to the first duration T-odd is less than or equal to ⅛.

For example, the difference between the first duration T-odd and the second duration T-even is 1H, the first duration T-odd is greater than or equal to 8H. For example, the first duration T-odd is 8H (as shown in FIG. 8), 9H, 10H and so on, the second duration T-even is 7H (as shown in FIG. 8), 8H, 9H and so on, which is not limited in the present disclosure.

By using the driving method provided in this implementation, a display baseplate can be driven, in the display baseplate, the structures of the first pixel driving circuit 131 and the second pixel driving circuit 132 can be the same. For example, both the first pixel driving circuit 131 and the second pixel driving circuit 132 adopt the circuit connection structure shown in FIG. 2, and the component structures in this circuit connection structure are also the same.

Among them, the first duration T-odd is the supplementary charging duration of the first pixel driving circuit 131, and the second duration T-even is the supplementary charging duration of the second pixel driving circuit 132. In FIG. 3, the first duration T-odd is 2H, and the second duration T-even is 1H. In FIG. 8, the first duration T-odd is 8H, and the second duration T-even is 7H.

This implementation is equivalent to shifting the falling edge of the compensation control signal Gate-N back on the basis of the compensation control signal shown in FIG. 3, thereby extending the first duration T-odd and the second duration T-even, thereby extending the supplementary charging durations of the first pixel driving circuit 131 and the second pixel driving circuit 132, reducing the proportion of the difference between the two supplementary charging durations in the first duration, and reducing the impact of the difference in supplementary charging duration. Due to the rapid decay of the charging current during the supplementary charging process, the charging rate of the second node N2 approaches saturation. Therefore, as the supplementary charging duration increases, the impact of the difference in supplementary charging duration can be ignored.

Figure 9:
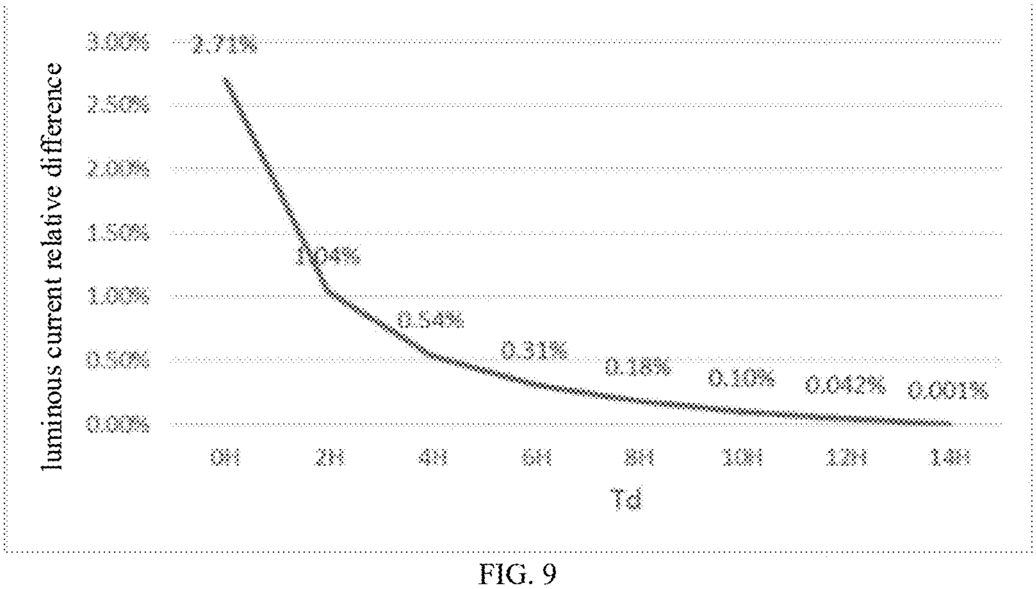
FIG. 9 shows a relative difference in luminous current between the first light emitting device and the second light emitting device under different amounts of backward shift.

Referring to FIG. 9, the relative difference in luminous current between the first light emitting device LD1 and the second light emitting device LD2 under different amounts of backward shift is shown. Among them, the relative difference on the vertical axis is the ratio of the difference between the luminous current of the first light emitting device LD1 and the luminous current of the second light emitting device LD2 to the luminous current of the first light emitting device LD1. The amount of backward shift Td on the horizontal axis represents the duration of the falling edge of the compensation control signal backward shift based on the compensation control signal shown in FIG. 3. As shown in FIG. 9, with the increase of the amount of backward shift, the relative difference in the luminous current between the first light emitting device LD1 and the second light emitting device LD2 decreases. In order to achieve that when the same signal is written to the data terminal Data of the first pixel driving circuit 131 and the data terminal Data of the second pixel driving circuit 132, the relative difference in the luminous current between the first light emitting device LD1 and the second light emitting device LD2 is less than or equal to 0.4%, and the amount of backward shift may be greater than or equal to 6H. Therefore, the first duration T-odd is extended from 2H shown in FIGS. 3 to 8H, and the second duration T-even is extended from 1H shown in FIGS. 3 to 7H.

In this implementation, for example, the pulse width of the first write control signal Gate-P_Odd and the pulse width of the second write control signal Gate-P_Even may be the same, as shown in FIG. 8, with both pulse widths being Tch, which is not limited in the present disclosure.

It should be noted that the driving method provided in this implementation can also drive display baseplate in which the first pixel driving circuit 131 and the second pixel driving circuit 132 have different structures.

Figure 10:
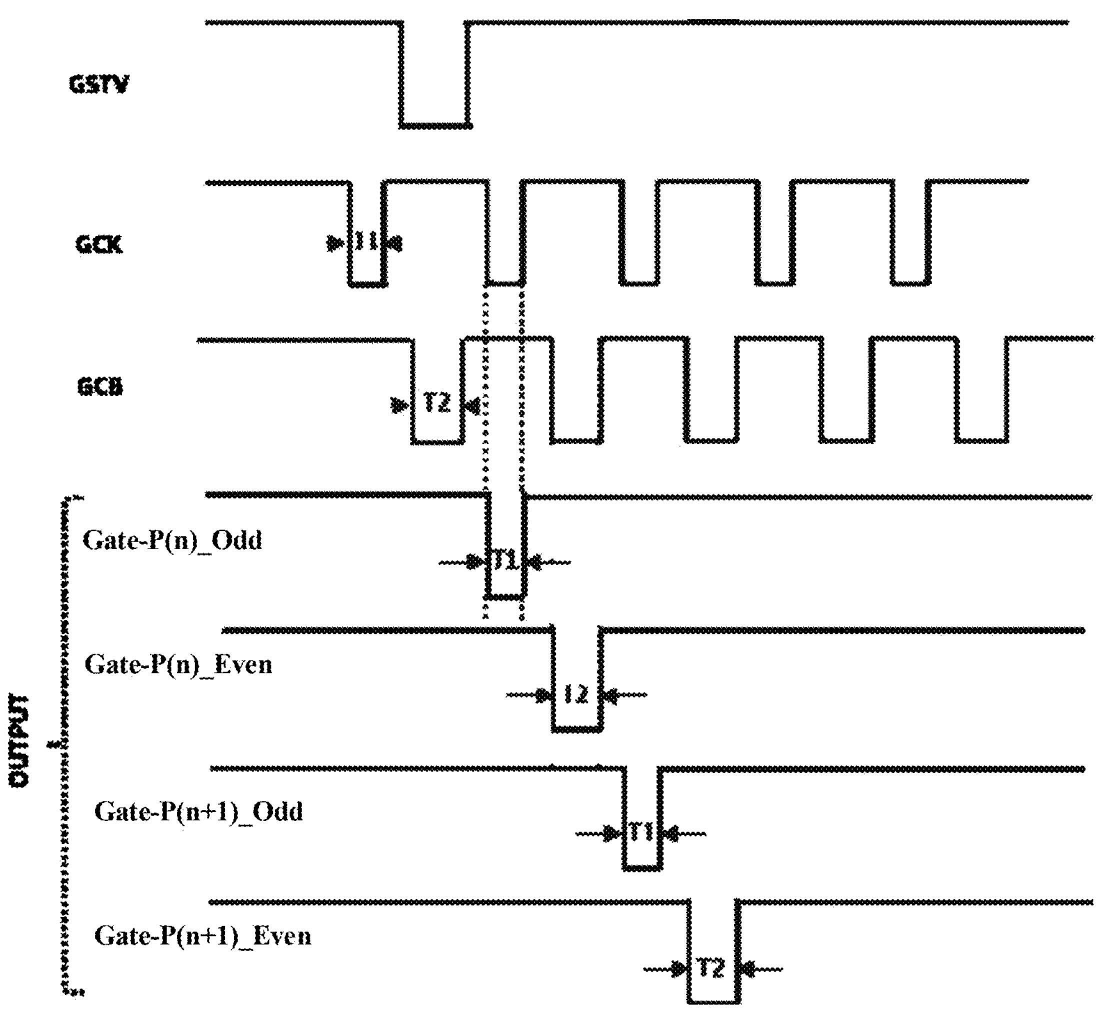
FIG. 10 shows a timing diagram of a third type of driving signal of the first type of pixel driving circuit.

In order to reduce the luminance difference between the odd row and the even row, in some implementations, as shown in FIG. 10, the pulse width T1 of the first write control signal Gate-P(n)_Odd is different from the pulse width T2 of the second write control signal Gate-P(n)_Even.

By using the driving method provided in this implementation, a display baseplate can be driven, in the display baseplate, the structures of the first pixel driving circuit 131 and the second pixel driving circuit 132 can be the same. For example, both the first pixel driving circuit 131 and the second pixel driving circuit 132 adopt the circuit connection structure shown in FIG. 2, and the component structures in this circuit connection structure are also the same.

By performing differentiated design on the pulse width T1 of the first write control signal and the pulse width T2 of the second write control signal, it is possible to offset or balance the actual charging time difference between the first pixel driving circuit 131 and the second pixel driving circuit 132 for the second node N2, reduce or eliminate the final charging potential difference between the second nodes N2 in the first pixel driving circuit 131 and the second pixel driving circuit 132, reduce or eliminate the difference in in luminous current and luminance between the first light emitting device LD1 and the second light emitting device LD2, and improve or eliminate the fine horizontal-stripe defects.

Furthermore, as shown in FIG. 10, within one frame period, the pulse duration of the first write control signal Gate-P(n)_Odd precedes the pulse duration of the second write control signal Gate-P(n)_Even, and the pulse width T1 of the first write control signal Gate-P(n)_Odd is less than the pulse width T2 of the second write control signal Gate-P(n)_Even.

As shown in FIG. 10, since the pulse duration of the first write control signal Gate-P(n)_Odd precedes the pulse duration of the second write control signal Gate-P(n) Even, the supplementary charging duration of the first pixel driving circuit 131 for the second node N2 is greater than that of the second pixel driving circuit 132. By reducing the pulse width T1 of the first write control signal Gate-P(n)_odd, the effective charging duration of the first pixel driving circuit 131 for the second node N2 can be shortened. By adjusting the pulse width T1 of the first write control signal Gate-P (n)_odd and the pulse width T2 of the second write control signal Gate-P(n)_Even, the final charged potentials of the second nodes N2 in the first pixel driving circuit 131 and the second pixel driving circuit 132 can be consistent, thus improving the fine horizontal-stripe defects.

Due to the high charging rate during the effective charging phase, in order to ensure that the second nodes N2 in the first pixel driving circuit 131 and the second pixel driving circuit 132 are charged to the same potential, in some implementations, the difference between the pulse width T2 of the second write control signal and the pulse width T1 of the first write control signal is less than the phase difference between the pulse duration of the first write control signal and the pulse duration of the second write control signal.

For example, when the phase difference between the pulse duration of the first write control signal and the pulse duration of the second write control signal is 1H, the difference between the pulse width T2 of the second write control signal and the pulse width T1 of the first write control signal is less than 1H.

It should be noted that in FIG. 10, when the first write control signal is Gate-P(n)_Odd, the second write control signal is Gate-P(n)_Even. When the first write control signal is Gate-P(n+1)_Odd, the second write control signal is Gate-P(n+1)_Even.

It should be noted that the driving method provided in this implementation can also drive display baseplates in which the first pixel driving circuit 131 and the second pixel driving circuit 132 have different structures.

In order to reduce the luminance difference between the odd row and the even row, in some implementations, before step S01, the method further includes:

Step S11: providing a first clock signal GCK and a second clock signal GCB to the first gate driving circuit 11, so that the first gate driving circuit 11 generates the first write control signal according to the first clock signal GCK, and generates the second write control signal according to the second clock signal GCB. As shown in FIG. 10, a duty cycle of the first clock signal GCK is less than a duty cycle of the second clock signal GCB. The pulse period of the first clock signal GCK is the same as that of the second clock signal GCB.

Figure 11:
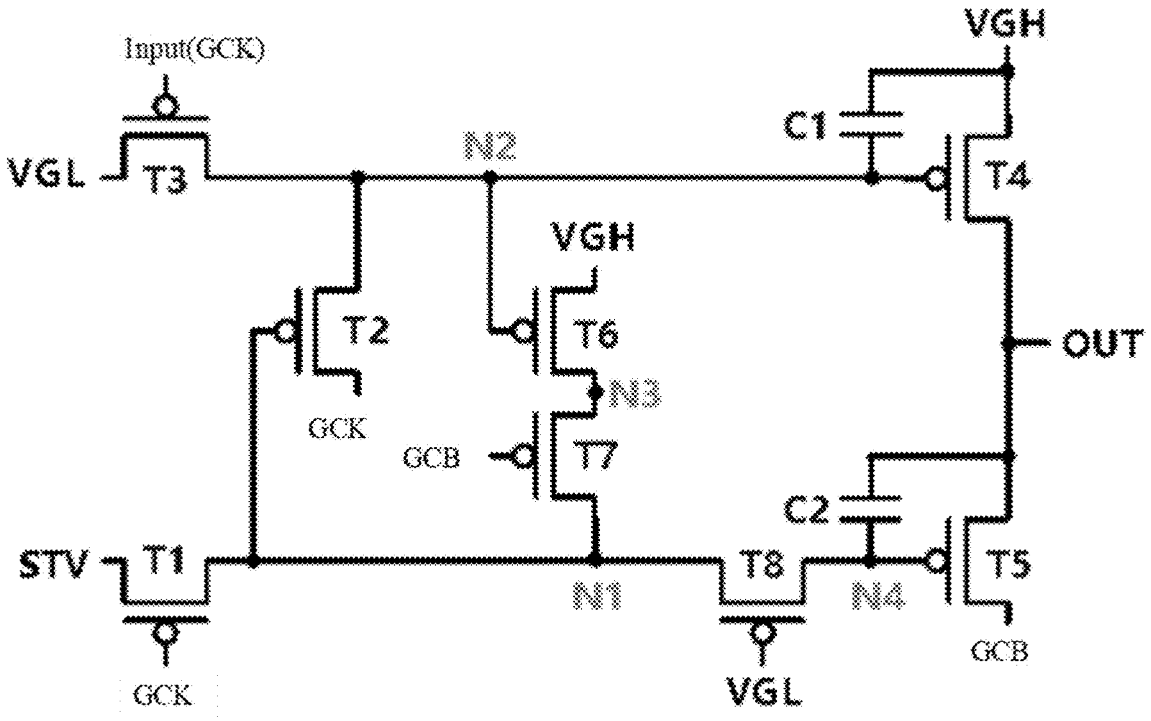
FIG. 11 shows a schematic diagram of a circuit structure of a first shift register.

For example, referring to FIG. 11, a schematic diagram of the circuit structure of a first shift register is shown. As shown in FIG. 11, the first shift register is an 8T1C GOA circuit, which is connected to the input signal terminal Input and outputs a write control signal according to the signal of the input signal terminal Input. The input signal terminal Input of the first shift register at the nth stage Pgate GOA(n) is connected to the first clock signal line, and the input signal terminal Input of the first shift register at the (n+1)th stage Pgate GOA(n+1) is connected to the second clock signal line, so that the first shift register at the nth stage Pgate GOA(n) can generate the first write control signal according to the first clock signal GCK input from the first clock signal line, and the first shift register at the (n+1)th stage Pgate GOA(n+1) can generate the second write control signal according to the second clock signal GCB input from the second clock signal line. Among them, one pulse width of the first write control signal is equal to one pulse width of the first clock signal GCK, and one pulse width of the second write control signal is equal to one pulse width of the second clock signal GCB.

In some implementations, as shown in FIG. 6, the pixel driving circuit 13 further includes a first reset module 61 and a second capacitor C2, the first reset module 61 is connected to a reset control terminal Gate-P2, a first reset terminal Vinit2 and a fourth node N4, the fourth node N4 is further connected to a first electrode of the light emitting device, a first electrode plate of the second capacitor C2 is connected to the first node N1, and a second electrode plate of the second capacitor C2 is connected to the fourth node N4, the write control terminal Gate-P1 of the first pixel driving circuit 131 is connected to an output terminal of a first shift register at an nth stage Pgate GOA, an reset control terminal Gate-P2 of the first pixel driving circuit 131 is connected to an output terminal of a first shift register at an (n+x)th stage Pgate GOA, the write control terminal Gate-P1 of the second pixel driving circuit 132 is connected to an output terminal of a first shift register at an (n+i)th stage Pgate GOA, a reset control terminal Gate-P2 of the second pixel driving circuit 132 is connected to an output terminal of a first shift register at an (n+i+x)th stage Pgate GOA, and all n, x and i are positive integers greater than or equal to 1. In this implementation, in step S01, after controlling the first gate driving circuit 11 to output a first write control signal to the write control terminal Gate-P1 of the first pixel driving circuit 131, and to output a second write control signal to the write control terminal Gate-P1 of the second pixel driving circuit 132, the method further includes:

Step S21: controlling the first gate driving circuit 11 to output a first reset control signal to the reset control terminal Gate-P2 of the first pixel driving circuit 131, and to output a second reset control signal to the reset control terminal Gate-P2 of the second pixel driving circuit 132. As shown in FIG. 7, within one frame period, the pulse duration of the compensation control signal covers a pulse duration of the first reset control signal and a pulse duration of the second reset control signal, and the pulse duration of the first reset control signal does not overlap with the pulse duration of the second reset control signal.

In specific implementation, as shown in FIG. 7, the pulse width of the first write control signal and the pulse width of the second write control signal can be the same, for example, both are Tch.

It should be noted that the driving method may also include more steps, which can be determined according to actual needs, and the present disclosure does not limit this. For a detailed explanation of the driving method and technical effects, please refer to the description of the display baseplate in the previous text, which will not be repeated here.

In the present disclosure, the meaning of "plurality of" refers to two or more, and the meaning of "at least one" refers to one or more, unless otherwise specified.

In the present disclosure, the terms "up", "down", etc. indicate orientation or positional relationships based on the orientation or positional relationships shown in the accompanying drawings, only for the convenience of describing the present disclosure and simplifying the description, and do not indicate or imply that the device or component referred to must have a specific orientation, be constructed and operated in a specific orientation, and therefore cannot be understood as a limitation of the present disclosure.

In this specification, the terms "including", "comprising", or any other variation thereof are intended to encompass non-exclusive inclusion, such that a process, method, product, or equipment that includes a series of elements includes not only those elements, but also other elements not explicitly listed, or elements inherent to such process, method, product, or equipment. Without further limitations, the element defined by the statement "including one . . . " does not exclude the existence of other identical elements in the process, method, product, or device that includes the element in question.

The terms "one embodiment", "some embodiments", "exemplary embodiments", "one or more embodiments", "examples", "one example", "some examples", etc. referred to in this specification are intended to indicate that specific features, structures, materials, or characteristics related to the embodiment or example are included in at least one embodiment or example disclosed herein. The schematic representation of the above terms does not necessarily refer to the same embodiment or example. In addition, the specific features, structures, materials, or characteristics described may be included in any appropriate manner in any one or more embodiments or examples.

In this specification, relational terms such as first and second are only used to distinguish one entity or operation from another, and do not necessarily require or imply any actual relationship or order between these entities or operations.

When describing some embodiments, expressions such as "coupling" and "connection" may be used. For example, in describing some embodiments, the term "connection" may be used to indicate that two or more components have direct physical or electrical contact with each other. For example, in describing some embodiments, the term "coupling" may be used to indicate that two or more components have direct physical or electrical contact. However, the term "coupled" or "communicably coupled" may also refer to two or more components that do not have direct contact with each other but still cooperate or interact with each other. The embodiments disclosed here are not necessarily limited to the content of this specification.

"Connection" can be a direct or indirect connection.

"At least one of A, B, and C" has the same meaning as "at least one of A, B, or C" and includes the following combinations of A, B, and C: only A, only B, only C, combinations of A and B, combinations of A and C, combinations of B and C, and combinations of A, B, and C.

"A and/or B" includes the following three combinations: only A, only B, and a combination of A and B.

As used in this specification, the term "if" is optionally interpreted as meaning "when" or "at" or "in response to a determination" or "in response to a detection" depending on the context. Similarly, depending on the context, the phrases "if determined . . . " or "if [stated condition or event] is detected" can be interpreted as referring to "when determined . . . " or "in response to determining . . . " or "when [stated condition or event] is detected" or "in response to detecting [stated condition or event]".

The use of "for" or "configured as" in this specification implies an open and inclusive language, which does not exclude devices that are applicable or configured to perform additional tasks or steps.

The use of "based on" or "according to" in this specification implies openness and inclusiveness. A process, step, calculation, or other action based on one or more of the conditions or values described, which may be based on other conditions or beyond the values described in practice. The process, steps, calculations, or other actions based on one or more of the stated conditions or values may, in practice, be based on other conditions or beyond the stated values.

As used in this specification, "approximately", "roughly", or "approximately" include the values described and the average value within an acceptable deviation range of a specific value, where the acceptable deviation range is determined by those of ordinary skill in the art taking into account the measurement being discussed and the errors associated with the measurement of a specific quantity (i.e., limitations of the measurement system).

As used in this specification, "parallel", "vertical", "equal", and "flush" include the situations described and situations that are similar to the described situations, and the range of the similar situations is within an acceptable deviation range, where the acceptable deviation range is determined by those of ordinary skill in the art considering the measurement being discussed and the errors associated with the measurement of a specific quantity (i.e., the limitations of the measurement system). For example, "parallelism" includes absolute parallelism and approximate parallelism, where the acceptable deviation range for approximate parallelism can be within 5 degrees of deviation. "Vertical" includes absolute vertical and approximate vertical, where the acceptable deviation range for approximate vertical can also be within 5°, for example. "Equal" includes absolute equality and approximate equality, where the acceptable deviation range for approximate equality can be, for example, equal. The difference between the two is less than or equal to 5% of either one. "Flush" includes absolute leveling and approximate leveling, where the acceptable deviation range for approximate leveling can be, for example, that the distance between two levels of leveling is less than or equal to 5% of either dimension.

It should be understood that when a layer or component is referred to as being on another layer or substrate, it may be directly on another layer or substrate, or there may be an intermediate layer between the layer or component and another layer or substrate.

This specification describes exemplary embodiments with reference to cross-sectional and/or plan views as idealized illustrative figures. In the attached figure, the thickness of the layers and regions has been enlarged for clarity. Therefore, it can be assumed that there may be changes in the shape relative to the drawings due to factors such as manufacturing technology and/or tolerances. Therefore, the exemplary embodiments should not be interpreted as limited to the shapes of the regions shown in this specification, but rather include shape deviations caused by, for example, manufacturing. For example, etched areas shown as rectangles typically have curved features. Therefore, the areas shown in the figures are essentially illustrative, and their shapes are not intended to show the actual shape of the device's area, nor are they intended to limit the scope of the exemplary embodiments.

Finally, it should be noted that the above embodiments are only used to illustrate the disclosed technical solution and not to limit it. Although the present disclosure has been described in detail with reference to the aforementioned embodiments, a person skilled in the art should understand that they can still modify the technical solutions described in the aforementioned embodiments, or equivalently replace some of the technical features. And these modifications or substitutions do not depart from the essence and scope of the corresponding technical solutions disclosed in the present disclosure.

The invention claimed is:

1. A display baseplate, comprising a substrate, as well as a first gate driving circuit, a second gate driving circuit, and a plurality of pixel driving circuits arranged in array, that are disposed on a side of the substrate; wherein the first gate driving circuit comprises a plurality of first shift registers cascaded to each other, the second gate driving circuit comprises a plurality of second shift registers cascaded to each other, and each of the plurality of pixel driving circuits comprises:

a writing module, connected to a data terminal, a first node and a write control terminal, and configured for writing a signal of the data terminal to the first node according to a signal of the write control terminal;

a driver module, connected to the first node, a second node and a third node, and configured for writing a voltage of the first node to the third node according to a potential of the second node, wherein the third node is further connected to a light emitting device; and a compensation module, connected to the third node, the second node and a compensation control terminal, and configured for writing a signal of the third node to the second node according to a signal of the compensation control terminal;

wherein the plurality of pixel driving circuits comprise a first pixel driving circuit and a second pixel driving circuit located in different rows, a write control terminal of the first pixel driving circuit and a write control terminal of the second pixel driving circuit are connected to different first shift registers, and a compensation control terminal of the first pixel driving circuit and a compensation control terminal of the second pixel driving circuit are connected to a same second shift register; and the first pixel driving circuit is configured for driving a light emitting device of a first pixel to emit light, the second pixel driving circuit is configured for driving a light emitting device of a second pixel to emit light, and when a same signal is written to a data terminal of the first pixel driving circuit and a data terminal of the second pixel driving circuit, a difference in luminance between the first pixel and the second pixel is less than or equal to two gray levels.

2. The display baseplate according to claim 1, wherein a structure of the first pixel driving circuit is different from a structure of the second pixel driving circuit.

3. The display baseplate according to claim 2, wherein each of the plurality of pixel driving circuits further comprises:

a first capacitor, wherein a first electrode plate of the first capacitor is connected to a first voltage terminal, a second electrode plate of the first capacitor is connected to the second node, and the first capacitor is configured for storing a signal of the second node;

wherein a capacitance value of a first capacitor in the first pixel driving circuit is different from a capacitance value of a first capacitor in the second pixel driving circuit.

4. The display baseplate according to claim 3, wherein the write control terminal of the first pixel driving circuit is connected to an output terminal of a first shift register at an nth stage, the write control terminal of the second pixel driving circuit is connected to an output terminal of a first shift register at an (n+i)th stage, and both n and i are positive integers greater than or equal to 1;

wherein the capacitance value of the first capacitor in the first pixel driving circuit is greater than the capacitance value of the first capacitor in the second pixel driving circuit.

5. The display baseplate according to claim 4, wherein the first electrode plate of the first capacitor is provided with an opening, and an orthographic projection of the opening on the substrate is located in a range of an orthographic projection of the second electrode plate of the first capacitor on the substrate;

wherein an area of an orthographic projection of an opening in the first pixel driving circuit on the substrate is less than an area of an orthographic projection of an opening in the second pixel driving circuit on the substrate.

6. The display baseplate according to claim 2, wherein the driver module comprises:

a first transistor, wherein a control electrode of the first transistor is connected to the second node, a first electrode of the first transistor is connected to the first node, and a second electrode of the first transistor is connected to the third node;

wherein a channel width-to-length ratio of a first transistor in the first pixel driving circuit is different from a channel width-to-length ratio of a first transistor in the second pixel driving circuit.

7. The display baseplate according to claim 6, wherein the write control terminal of the first pixel driving circuit is connected to an output terminal of a first shift register at an nth stage, the write control terminal of the second pixel driving circuit is connected to an output terminal of a first shift register at an (n+i)th stage, and both n and i are positive integers greater than or equal to 1;

wherein the channel width-to-length ratio of the first transistor in the first pixel driving circuit is less than the channel width-to-length ratio of the first transistor in the second pixel driving circuit.

8. The display baseplate according to claim 1, wherein a structure of the first pixel driving circuit is the same as a structure of the second pixel driving circuit.

9. The display baseplate according to claim 8, wherein each of the plurality of pixel driving circuits further comprises:

a first reset module, connected to a reset control terminal, a first reset terminal and a fourth node, and configured for writing a signal of the first reset terminal to the fourth node according to a signal of the reset control terminal, wherein the fourth node is further connected to a first electrode of the light emitting device; and a second capacitor, wherein a first electrode plate of the second capacitor is connected to the first node, and a second electrode plate of the second capacitor is connected to the fourth node;

wherein the write control terminal of the first pixel driving circuit is connected to an output terminal of a first shift register at an nth stage, an reset control terminal of the first pixel driving circuit is connected to an output terminal of a first shift register at an (n+x)th stage, the write control terminal of the second pixel driving circuit is connected to an output terminal of a first shift register at an (n+i)th stage, a reset control terminal of the second pixel driving circuit is connected to an output terminal of a first shift register at an (n+i+x)th stage, and all n, x and i are positive integers greater than or equal to 1.

10. The display baseplate according to claim 9, wherein x is greater than or equal to 2, and less than or equal to 10.

11. The display baseplate according to claim 1, wherein the compensation module comprises:

a second transistor, wherein a control electrode of the second transistor is connected to the compensation control terminal, a first electrode of the second transistor is connected to the third node, and a second electrode of the second transistor is connected to the second node;

the writing module comprises: a third transistor, wherein a control electrode of the third transistor is connected to the write control terminal, a first electrode of the third transistor is connected to the data terminal, and a second electrode of the third transistor is connected to the first node;

wherein the second transistor comprises an oxide transistor, and the third transistor comprises a polycrystalline silicon transistor.

12. The display baseplate according to claim 1, wherein the first pixel driving circuit is located in an odd row, and the second pixel driving circuit is located in an even row adjacent to the odd row.

13. A display device, comprising: the light emitting device, and the display baseplate according to claim 1, wherein the display baseplate is connected to the light emitting device, and configured for driving the light emitting device to emit light.

14. A driving method, applied to the display baseplate according to claim 1, and the driving method comprises:

controlling the first gate driving circuit to output a first write control signal to the write control terminal of the first pixel driving circuit, and to output a second write control signal to the write control terminal of the second pixel driving circuit, and controlling the second gate driving circuit to output a compensation control signal to the compensation control terminal of the first pixel driving circuit and the compensation control terminal of the second pixel driving circuit, so that the first pixel driving circuit writes a signal from the data terminal of the first pixel driving circuit to a second node of the first pixel driving circuit, and the second pixel driving circuit writes a signal from the data terminal of the second pixel driving circuit to a second node of the second pixel driving circuit, wherein within one frame period, a pulse duration of the compensation control signal covers a pulse duration of the first write control signal and a pulse duration of the second write control signal, and the pulse duration of the first write control signal does not overlap with the pulse duration of the second write control signal.

15. The driving method according to claim 14, wherein within one frame period, the pulse duration of the first write control signal precedes the pulse duration of the second write control signal, a duration between a pulse trailing edge of the compensation control signal and a pulse trailing edge of the first write control signal is a first duration, a duration between the pulse trailing edge of the compensation control signal and the pulse trailing edge of the second write control signal is a second duration, and a ratio of a difference between the first duration and the second duration to the first duration is less than or equal to ⅛.

16. The driving method according to claim 15, wherein the difference between the first duration and the second duration is 1H, the first duration is greater than or equal to 8H, and H is a duration required for the display baseplate to scan one row of the pixel driving circuits.

17. The driving method according to claim 14, wherein a pulse width of the first write control signal is different from a pulse width of the second write control signal.

18. The driving method according to claim 17, wherein within one frame period, the pulse duration of the first write control signal precedes the pulse duration of the second write control signal, and the pulse width of the first write control signal is less than the pulse width of the second write control signal.

19. The driving method according to claim 18, wherein before the step of controlling the first gate driving circuit to output a first write control signal to the write control terminal of the first pixel driving circuit, and to output a second write control signal to the write control terminal of the second pixel driving circuit, the method further comprises:

providing a first clock signal and a second clock signal to the first gate driving circuit, so that the first gate driving circuit generates the first write control signal according to the first clock signal, and generates the second write control signal according to the second clock signal, wherein a duty cycle of the first clock signal is less than a duty cycle of the second clock signal.

20. The driving method according to claim 14, wherein when each of the plurality of pixel driving circuits further comprises a first reset module and a second capacitor, the first reset module is connected to a reset control terminal, a first reset terminal and a fourth node, the fourth node is further connected to a first electrode of the light emitting device, a first electrode plate of the second capacitor is connected to the first node, and a second electrode plate of the second capacitor is connected to the fourth node, the write control terminal of the first pixel driving circuit is connected to an output terminal of a first shift register at an nth stage, an reset control terminal of the first pixel driving circuit is connected to an output terminal of a first shift register at an (n+x)th stage, the write control terminal of the second pixel driving circuit is connected to an output terminal of a first shift register at an (n+i)th stage, a reset control terminal of the second pixel driving circuit is connected to an output terminal of a first shift register at an (n+i+x)th stage, and all n, x and i are positive integers greater than or equal to 1, after the step of controlling the first gate driving circuit to output a first write control signal to the write control terminal of the first pixel driving circuit, and to output a second write control signal to the write control terminal of the second pixel driving circuit, the method further comprises:

controlling the first gate driving circuit to output a first reset control signal to the reset control terminal of the first pixel driving circuit, and to output a second reset control signal to the reset control terminal of the second pixel driving circuit, wherein within one frame period, the pulse duration of the compensation control signal covers a pulse duration of the first reset control signal and a pulse duration of the second reset control signal, and the pulse duration of the first reset control signal does not overlap with the pulse duration of the second reset control signal.

* * * * *